United States Patent
Huang et al.

(10) Patent No.: US 7,576,414 B2
(45) Date of Patent: Aug. 18, 2009

(54) ELECTROSTATIC DISCHARGE (ESD) PROTECTION STRUCTURE

(75) Inventors: Rui Huang, Singapore (SG); Yaojian Lin, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 11/934,654

(22) Filed: Nov. 2, 2007

(65) Prior Publication Data
US 2009/0117729 A1    May 7, 2009

(51) Int. Cl.
*H01L 23/20* (2006.01)
*H01L 21/00* (2006.01)

(52) U.S. Cl. .............. 257/630; 257/E23.013; 257/E21.51; 438/121

(58) Field of Classification Search .......... 257/630, 257/E23.013, E21.51; 438/121
See application file for complete search history.

(56) References Cited

U.S. PATENT DOCUMENTS

| 5,818,101 | A  | * | 10/1998 | Schuster | 257/659 |
| 5,939,784 | A  | * | 8/1999  | Glenn    | 257/710 |
| 6,472,598 | B1 | * | 10/2002 | Glenn    | 174/535 |
| 6,686,649 | B1 | * | 2/2004  | Mathews et al. | 257/659 |
| 7,196,406 | B2 |   | 3/2007  | Kuzmenka |         |
| 2007/0187822 | A1 | * | 8/2007 | Chen et al. | 257/737 |

* cited by examiner

*Primary Examiner*—W. David Coleman
(74) *Attorney, Agent, or Firm*—Robert D. Atkins

(57) ABSTRACT

A semiconductor device has a substrate with a plurality of active devices formed thereon. A contact pad is formed on the substrate. A solder bump is formed on the contact pad. An electrostatic discharge (ESD) bump electrode is formed on the contact pad. The ESD bump electrode has a tip. The ESD bump electrode is made with gold. A chip carrier substrate has a contact pad metallurgically connected to the solder bump. The chip carrier substrate also has a ground plate. The ground plate is a low impedance ground point. The tip of the ESD bump electrode is separated from the ground plate by a distance according to ESD sensitivity of the active devices. The distance is determined by a ratio of a discharging threshold voltage for ESD sensitivity of the active device to be protected to an atmosphere discharging voltage.

24 Claims, 2 Drawing Sheets

ELECTROSTATIC DISCHARGE (ESD) PROTECTION STRUCTURE

FIELD OF THE INVENTION

The present invention relates in general to semiconductor devices and, more particularly, to a semiconductor device having an electrostatic discharge protection structure.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

Semiconductor devices are susceptible to damage from electrostatic discharge. When electrostatic charges accumulate on a human body, a high static potential is formed with respect to ground. If the human body touches or comes in close proximity to any part of the IC, the static potential can discharge through the IC and inject large currents which can damage the active circuits on the IC. If the electric field is greater than the break down voltage of air, then the static potential can discharge through the air space to the IC. The static potential is typically much greater than the breakdown voltage of the semiconductor device. If the breakdown voltage of the semiconductor device is exceeded, then the IC can be rendered defective well before its useful life expectancy.

A need exists to protect semiconductor devices from electrostatic discharge.

SUMMARY OF THE INVENTION

In one embodiment, the present invention is a method of making a semiconductor device comprising the steps of providing a substrate having a plurality of active devices formed thereon, forming a contact pad on the substrate, forming a solder bump on the contact pad of the substrate, forming an electrostatic discharge (ESD) bump electrode on the contact pad of the substrate, the ESD bump electrode having a tip, and providing a chip carrier substrate having a contact pad metallurgically connected to the solder bump. The chip carrier substrate further includes a ground plate. The tip of the ESD bump electrode is separated from the ground plate by a distance.

In another embodiment, the present invention is a method of making a semiconductor device comprising the steps of providing a substrate having a plurality of active devices formed thereon, forming a contact pad on the substrate, forming a solder bump on the contact pad of the substrate, forming an ESD electrode on the contact pad of the substrate, and providing a chip carrier substrate having a contact pad connected to the solder bump. The chip carrier substrate further includes a ground plate. The ESD bump electrode is separated from the ground plate by a distance. In another embodiment, the present invention is a method of making a semiconductor device comprising the steps of providing a substrate having a plurality of active devices formed thereon, forming an interconnect site on the substrate, forming a contact structure on the interconnect site of the substrate, forming an electrostatic discharge (ESD) structure between the substrate and the chip carrier substrate, the ESD structure including an ESD electrode and ground plate, and providing a chip carrier substrate having an interconnect site connected to the contact structure. The ESD bump electrode is separated from the ground plate by a distance.

In another embodiment, the present invention is a semiconductor device comprising a substrate having a plurality of active devices formed thereon. A contact pad is formed on the substrate. A solder bump is formed on the contact pad. An ESD electrode is formed on the contact pad. A chip carrier substrate has a contact pad connected to the solder bump. The chip carrier substrate further includes a ground plate. The ESD bump electrode is separated from the ground plate by a distance.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
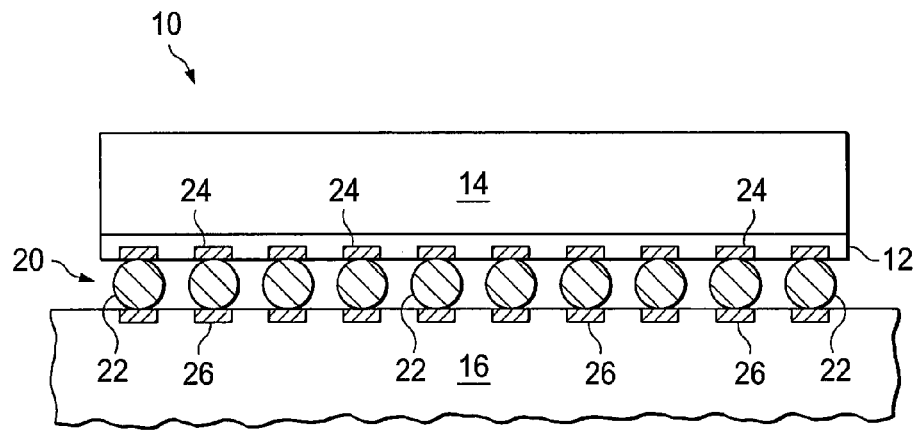
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive interconnects 22, e.g. solder bumps or balls, copper pillars, copper bars, and stacks of Au bumps. The solder bumps are formed on bump pads or interconnect sites 24, which are disposed on active area 12. The bump pads 24 connect to the active circuits by conduction tracks in active area 12. The conductive interconnects 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Semiconductor device 10 is susceptible to damage from electrostatic discharge. When electrostatic charges accumulate on a human body, a high static potential is formed with respect to ground. If the human body touches or comes in close proximity to any part of the IC, the static potential can discharge through the IC and inject large currents which can damage the active circuits on the IC. The break down voltage of air is about 33 kV/cm. If the electric field is greater than 33 kV/cm, then the static potential can discharge through the air space to the IC.

Figure 2:
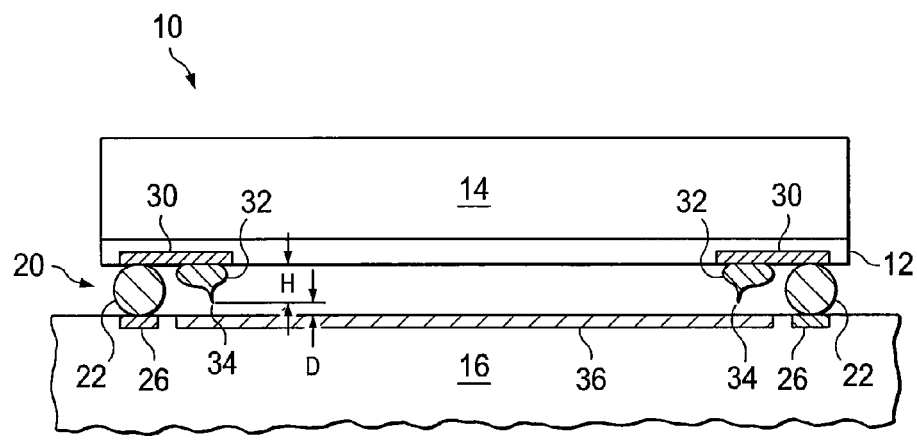
FIG. 2 illustrates ESD protection for a flip chip semiconductor device using a bump electrode with a tip formed on the contact pad.

FIG. 2 illustrates further detail of flip chip semiconductor device 10. Contact pads 30 are patterned and deposited on active area 12 of semiconductor device 10. Contact pads 30 are interconnect sites on which contact structures can be formed. Contact pads 30 can be made with aluminum (Al), copper (Cu), tin (Sn), nickel (Ni), gold (Au), silver (Ag), or other electrically conductive material. The deposition of contact pads 30 uses an evaporation, electrolytic plating, electroless plating, or screen printing process. Solder bumps 22 are one type of interconnect structure that can be formed on contact pads 30. Alternatively, copper pillars, copper bars, and stacks of Au bumps can be used for the interconnect structure. The interconnect structure can be arranged as an array.

To form solder bumps 22, an electrically conductive solder material is deposited over an under bump metallization layer (UBM) adjacent to contact pad 30. The electrically conductive material is any metal, e.g., Sn, lead (Pb), Ni, Au, Ag, Cu, bismuthinite (Bi), and alloys thereof, or mixtures of other conductive materials. In one embodiment, the solder material is 63 percent weight of Sn and 37 percent weight of Pb. The solder material is reflowed by heating the conductive material above its melting point to form spherical ball or bump 22. In some applications, solder bump 22 is reflowed a second time to improve electrical contact to the UBM layer.

Contact pads 30 have sufficient area to form conductive interconnects or solder bumps 22 and further to form metal electrostatic discharge (ESD) bump electrodes 32 on the contact pad. ESD bump electrodes 32 have a tip 34 and are made with Au. Solder bumps 22 metallurgically connect to contact pads 26 on chip carrier substrate 16. The height of solder bumps 22 creates a distance between active area 12 of substrate 14 and chip carrier substrate 16. The height H of ESD bump electrode 32, including tip 34, ranges from 65 to 85 μm, based on the solder standoff height of 150 μm+/−15 μm. The solder collapsed height and electrode height are selected to achieve the desired range of distance D, e.g. 50.75-100.75 μm. Ground plate 36 is formed on the surface of chip carrier substrate 16. Ground plate 36 is made with conductive materials such as Cu, Au, Al, or Ti, or any combination or alloy of these conductive materials. Ground plate 36 is continuous between tips 34. Ground plate 36 is connected to a low impedance ground point external to the IC. Tip 34 is separated from metal ground plate 36 by a distance D.

The metal surfaces of bump electrodes 32 and ground plate 36 operate as a metal-insulator-metal (MIM) capacitor with the atmosphere (air) between the metal surfaces as the insulator. The electric field E of the MIM capacitor is a function of the voltage V between the metal surfaces divided by the distance D, i.e., E=V/D. Different types of active circuits have different threshold voltage Vt for ESD susceptibility. Complementary metal oxide semiconductors (CMOS) devices have ESD sensitivity to damage in the range of 250-3000 volts; bipolar devices are susceptible to damage from ESD in the range of 380-7000 volts. The distance D is selected for the active device to be protected using equations (1) and (2) as follows:

$$Vt/D = Vair/1\ cm = 33\ kV/cm \qquad (1)$$

$$D = (1\ cm * Vt)/Vair \qquad (2)$$

where:
Vt is the discharging threshold voltage for ESD sensitivity of the active devices to be protected,
Vair is the atmosphere discharging voltage, which is 33 kV over 1cm separation, D is separation between ESD bump electrode 32 and ground plate 36.

The distance between the tip of the ESD bump electrode and the ground plate is determined by a ratio of a discharging threshold voltage for ESD sensitivity of the active device to be protected to an atmosphere discharging voltage. For example, with a CMOS device in active area 12 with Vt=250 volts, the distance D is made less than (1 cm*Vt)/Vair=(1 cm*250V)/33000V=75.75 µm so that the electric field of the MIM capacitor is less than the static potential applied to contact pad 30.

If a human body containing an electrostatic charge is brought in contact with or in close proximity to one of the solder bumps 22 of semiconductor device 10, then the high static potential is transferred to contact pad 30. In the present example, the static potential is greater than the electric field E of the MIM capacitor so the static potential is routed through ESD bump electrode 32 and tip 34 to ground plate 36 to safely discharge the electrostatic energy. The active circuitry on surface 12 is thus protected from the electrostatic discharge by ESD bump electrode 32.

The manufacturing variation in height of solder bumps 22 after reflow is about +/−15 µm. The manufacturing variation of height H of ESD bump electrodes 32 is typically about +/−10 µm. After reflow of the solder bump 22, the variation of D is about +/−25 µm. The ESD bump electrode 32 can be made with a single bump or a stack of bumps to create a desired separation distance D. In a multiple stack configuration, the bottom bump can be used as a probing point during test before stacking second or other bumps to prevent the damage on bond pad or solder ball during probing.

Figure 3:
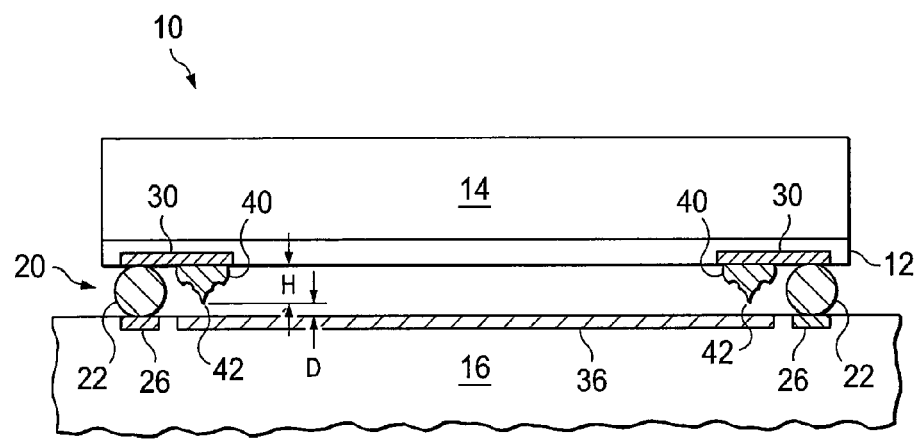
FIG. 3 illustrates an alternate embodiment of the ESD protection using a bump electrode with a tip formed on the contact pad.

FIG. 3 is an alternate embodiment of the ESD bump electrode. As described in FIG. 2, contact pads 30 are patterned and deposited on active area 12 of semiconductor device 10. Solder bumps 22 are formed on contact pads 30. Contact pads 30 have sufficient area to form solder bumps 22 and further to form metal ESD bump electrodes 40 on the contact pad. ESD bump electrodes 40 have a tip 42 and are made with Au. Tip 42 is formed substantially in the center of ESD bump electrode 40. The height H of ESD bump electrode 32, including tip 34, ranges from 65 to 85 µm, based on the solder standoff height of 150 µm+/−15 µm. The solder collapsed height and electrode height are selected to achieve the desired range of distance D, e.g. 50.75-100.75 µm. Ground plate 36 is formed on the surface of chip carrier substrate 16. Ground plate 36 is connected to a low impedance ground point external to the IC. Tip 42 is separated from metal ground plate 36 by a distance D.

The metal surfaces of electrodes 40 and ground plate 36 operate as a MIM capacitor with the air between the metal surfaces as the insulator. The electric field E of the MIM capacitor is a function of the voltage V between the metal surfaces divided by the distance D, i.e., E=V/D. If a human body containing an electrostatic charge is brought in contact with or in close proximity to one of the solder bumps 22 of semiconductor device 10, then the high static potential is transferred to contact pad 30. If the static potential is greater than the electric field E of the MIM capacitor, then the static potential is routed through ESD bump electrode 40 and tip 42 to ground plate 36 to safely discharge the electrostatic energy. The active circuitry on surface 12 is thus protected from the electrostatic discharge by ESD bump electrode 40.

Figure 4:
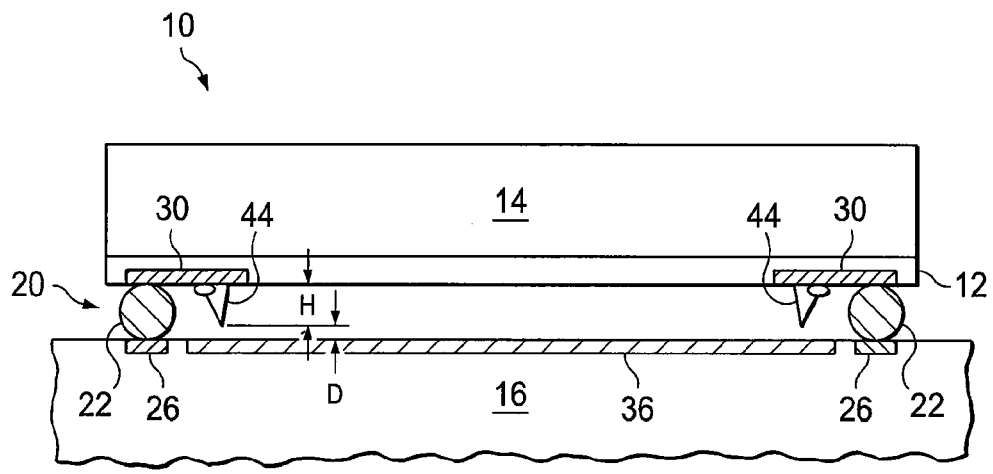
FIG. 4 illustrates the ESD protection using a wire loop formed on the contact pad.

In FIG. 4, another embodiment of the ESD electrode is shown. As described in FIG. 2, contact pads 30 are patterned and deposited on active area 12 of semiconductor device 10. Solder bumps 22 are formed on contact pads 30. Contact pads 30 have sufficient area to form solder bumps 22 and further to form metal ESD electrodes 44 on the contact pad. Each ESD electrode 44 is formed as a wire loop in a "V" shape. The wire is made with Au. The height H of ESD bump electrode 32, including tip 34, ranges from 65 to 85 µm, based on the solder standoff height of 150 µm+/−15 µm. The solder collapsed height and electrode height are selected to achieve the desired range of distance D, e.g. 50.75-100.75 µm. Ground plate 36 is formed on the surface of chip carrier substrate 16. Ground plate 36 is connected to a low impedance ground point external to the IC. The bottom of the V-shape, i.e., the tip of the ESD electrode, is separated from metal ground plate 36 by a distance D.

The metal surfaces of ESD electrodes 44 and ground plate 36 operate as a MIM capacitor with the air between the metal surfaces as the insulator. The electric field E of the MIM capacitor is a function of the voltage V between the metal surfaces divided by the distance D, i.e., E=V/D. If a human body containing an electrostatic charge is brought in contact with or in close proximity to one of the solder bumps 22 of semiconductor device 10, then the high static potential is transferred to contact pad 30. If the static potential is greater than the electric field E of the MIM capacitor, then the static potential is routed through ESD electrode 44 to ground plate 36 to safely discharge the electrostatic energy. The active circuitry on surface 12 is thus protected from the electrostatic discharge by ESD electrode 44.

Figure 5:
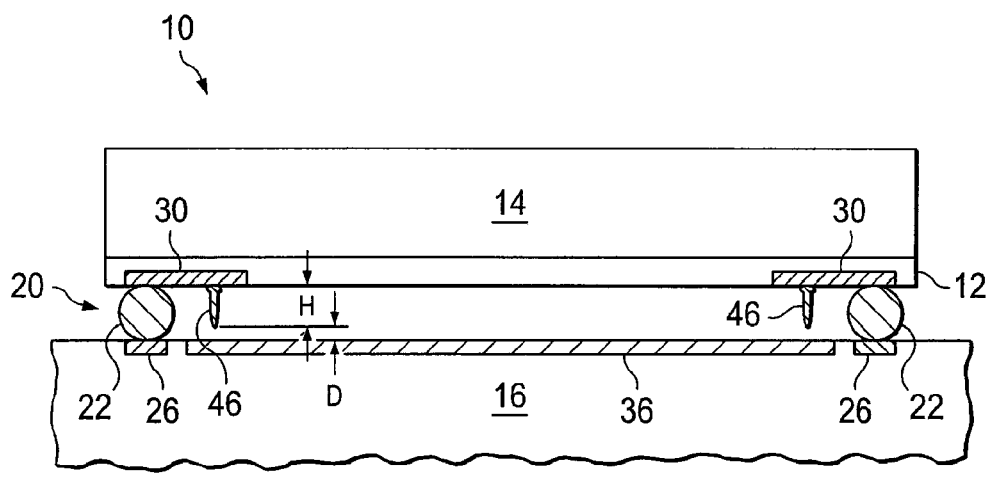
FIG. 5 illustrates ESD protection using a metal stick formed on the contact pad.

In FIG. 5, another embodiment of the ESD electrode is shown. As described in FIG. 2, contact pads 30 are patterned and deposited on active area 12 of semiconductor device 10. Solder bumps 22 are formed on contact pads 30. Contact pads 30 have sufficient area to form solder bumps 22 and further to form metal ESD electrodes 46 on the contact pad. Each ESD electrode 46 is formed as a metal stick connected to contact pad 30. The metal stick is made with Au. The height H of ESD bump electrode 32, including tip 34, ranges from 65 to 85 µm, based on the solder standoff height of 150 µm+/−15 µm. The solder collapsed height and electrode height are selected to achieve the desired range of distance D, e.g. 50.75-100.75 µm. Ground plate 36 is formed on the surface of chip carrier substrate 16. Ground plate 36 is connected to a low impedance ground point external to the IC. The bottom of the stick, i.e., the tip of the ESD electrode, is separated from metal ground plate 36 by a distance D.

The metal surfaces of ESD electrodes 46 and ground plate 36 operate as a MIM capacitor with the air between the metal surfaces as the insulator. The electric field E of the MIM capacitor is a function of the voltage V between the metal surfaces divided by the distance D, i.e., E=V/D. If a human body containing an electrostatic charge is brought in contact with or in close proximity to one of the solder bumps 22 of semiconductor device 10, then the high static potential is transferred to contact pad 30. If the static potential is greater than the electric field E of the MIM capacitor, then the static potential is routed through ESD electrode 46 to ground plate 36 to safely discharge the electrostatic energy. The active circuitry on surface 12 is thus protected from the electrostatic discharge by ESD electrode 46.

In an alternate embodiment, the electrode tip and ground plate are interchangeable. That is, the electrode tip can be formed on the substrate and the ground plate can be formed on the die.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
 a substrate having a plurality of active devices formed thereon;
 a contact pad formed on the substrate;
 a solder bump formed on the contact pad of the substrate;
 an electrostatic discharge (ESD) bump electrode having a height H formed on the contact pad of the substrate; and
 a chip carrier substrate having a contact pad connected to the solder bump, the chip carrier substrate further including a ground plate, wherein the ESD bump electrode is separated from the ground plate by a distance D which is exposed to atmosphere and selected as a ratio of discharging threshold voltage for the active devices to discharging voltage of the atmosphere;
 wherein the ESD bump electrode, atmosphere, and ground plate respectively constitute a metal-insulator-metal capacitor having an electric field determined by the distance D which is less than electrostatic energy induced on the contact pad for discharging the electrostatic energy to protect the active devices.

2. The semiconductor device of claim 1, wherein the ESD bump electrode includes a tip, wire loop, or a metal stick.

3. The semiconductor device of claim 1, wherein the ESD bump electrode is made with gold.

4. The semiconductor device of claim 1, wherein the ground plate is a low impedance ground point.

5. The semiconductor device of claim 1, wherein the height H of the ESD bump electrode ranges from 65 to 85 micrometers with a variation of +/−10 micrometers.

6. The semiconductor device of claim 1, wherein the ESD bump electrode is formed with stacked bumps to create the distance D.

7. A method of making a semiconductor device, comprising:
 providing a substrate having a plurality of active devices formed thereon;
 forming a contact pad on the substrate;
 forming a solder bump on the contact pad of the substrate;
 forming an electrostatic discharge (ESD) bump electrode on the contact pad of the substrate having a height H ranging from 65 to 85 micrometers with a variation of +/−10 micrometers, the ESD bump electrode having a tip; and
 providing a chip carrier substrate having a contact pad metallurgically connected to the solder bump, the chip carrier substrate further including a ground plate, wherein the tip of the ESD bump electrode is separated from the ground plate by a distance D which is exposed to atmosphere and selected as a ratio of discharging threshold voltage for the active devices to discharging voltage of the atmosphere;
 wherein the ESD bump electrode, atmosphere, and ground plate respectively constitute a metal-insulator-metal capacitor having an electric field determined by the distance D which is less than electrostatic energy induced on the contact pad for discharging the electrostatic energy to protect the active devices.

8. The method of claim 7, wherein the ESD bump electrode is made with gold.

9. The method of claim 7, wherein the ground plate is a low impedance ground point.

10. The method of claim 7, wherein the height H of the ESD bump electrode ranges from 65 to 85 micrometers with a variation of +/−10 micrometers.

11. The method of claim 7, further including forming the ESD bump electrode with stacked bumps to create the distance D.

12. A method of making a semiconductor device, comprising:
 providing a substrate having a plurality of active devices formed thereon;
 forming a contact pad on the substrate;
 forming a solder bump on the contact pad of the substrate;
 forming an electrostatic discharge (ESD) bump electrode on the contact pad of the substrate having a height H; and
 providing a chip carrier substrate having a contact pad connected to the solder bump, the chip carrier substrate further including a ground plate, wherein the ESD bump electrode is separated from the ground plate by a distance D which is exposed to atmosphere and selected as a ratio of discharging threshold voltage for the active devices to discharging voltage of the atmosphere;
 wherein the ESD bump electrode, atmosphere, and ground plate respectively constitute a metal-insulator-metal capacitor having an electric field determined by the distance D which is less than electrostatic energy induced on the contact pad for discharging the electrostatic energy to protect the active devices.

13. The method of claim 12, wherein the ESD bump electrode includes a wire loop.

14. The method of claim 12, wherein the ESD bump electrode includes a metal stick.

15. The method of claim 12, wherein the ESD bump electrode is made with gold.

16. The method of claim 12, wherein the ground plate is a low impedance ground point.

17. The method of claim 12, wherein the height H of the ESD bump electrode ranges from 65 to 85 micrometers with a variation of +/−10 micrometers.

18. The method of claim 12, further including forming the ESD bump electrode with stacked bumps to create the distance D.

19. A method of making a semiconductor device, comprising:
 providing a substrate having a plurality of active devices formed thereon;
 forming an interconnect site on the substrate;
 forming a contact structure on the interconnect site of the substrate;
 forming an electrostatic discharge (ESD) structure between the substrate and the chip carrier substrate, the ESD structure including an ESD bump electrode and ground plate; and
 providing a chip carrier substrate having an interconnect site connected to the contact structure, wherein the ESD bump electrode is separated from the ground plate by a distance D which is exposed to atmosphere and selected as a ratio of discharging threshold voltage for the active devices to discharging voltage of the atmosphere;
 wherein the ESD bump electrode, atmosphere, and ground plate respectively constitute a metal-insulator-metal capacitor having an electric field determined by the distance D which is less than electrostatic energy induced on the contact pad for discharging the electrostatic energy to protect the active devices.

20. The method of claim 19, wherein the ESD bump electrode includes a wire loop.

21. The method of claim 19, wherein the ESD bump electrode includes a metal stick.

22. The method of claim 19, wherein the ESD bump electrode is made with gold.

23. The method of claim 19, wherein the ESD bump electrode has a height H ranging from 65 to 85 micrometers with a variation of +/−10 micrometers.

24. The method of claim 19, further including forming the ESD bump electrode with stacked bumps to create the distance D.

* * * * *